(12) United States Patent
Butt et al.

(10) Patent No.: US 9,059,021 B2
(45) Date of Patent: Jun. 16, 2015

(54) FINFET DEVICE

(71) Applicant: International Business Machines Corporation, Armonk, NY (US)

(72) Inventors: Shahid A. Butt, Ossining, NY (US); Robert C. Wong, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 14/195,272

(22) Filed: Mar. 3, 2014

(65) Prior Publication Data

US 2014/0175564 A1 Jun. 26, 2014

Related U.S. Application Data

(62) Division of application No. 13/293,207, filed on Nov. 10, 2011, now Pat. No. 8,697,514.

(51) Int. Cl.

| H01L 21/20 | (2006.01) |
|---|---|
| H01L 27/088 | (2006.01) |
| H01L 21/8234 | (2006.01) |
| H01L 27/12 | (2006.01) |
| H01L 21/84 | (2006.01) |

(52) U.S. Cl.
CPC .... *H01L 27/0886* (2013.01); *H01L 21/823431* (2013.01); *H01L 27/1211* (2013.01); *H01L 21/845* (2013.01)

(58) Field of Classification Search
CPC ..... H01L 27/088; H01L 21/20; H01L 21/845; H01L 27/1211; H01L 27/0886; H01L 21/823431
USPC .............................. 257/401, E21.09, E27.06
See application file for complete search history.

(56) References Cited

U.S. PATENT DOCUMENTS

| 7,202,494 | B2 | 4/2007 | Blanchard et al. | |
|---|---|---|---|---|
| 7,550,773 | B2 | 6/2009 | Booth, Jr. et al. | |
| 2005/0124101 | A1* | 6/2005 | Beintner | 438/197 |
| 2005/0202618 | A1* | 9/2005 | Yagishita | 438/197 |
| 2005/0242395 | A1 | 11/2005 | Chen et al. | |
| 2005/0253193 | A1 | 11/2005 | Chen et al. | |
| 2007/0040223 | A1 | 2/2007 | Datta et al. | |
| 2007/0045736 | A1 | 3/2007 | Yagishita | |
| 2007/0145498 | A1 | 6/2007 | Metz et al. | |
| 2008/0185650 | A1 | 8/2008 | Chen et al. | |
| 2009/0001464 | A1 | 1/2009 | Booth, Jr. et al. | |
| 2009/0134472 | A1* | 5/2009 | Inaba | 257/390 |
| 2010/0052059 | A1 | 3/2010 | Lee | |
| 2011/0021027 | A1 | 1/2011 | Johnson | |
| 2011/0193163 | A1 | 8/2011 | Anderson et al. | |

* cited by examiner

*Primary Examiner* — Asok K Sarkar
*Assistant Examiner* — Dmitriy Yemelyanov
(74) *Attorney, Agent, or Firm* — Cantor Colburn LLP; Steven Meyer

(57) ABSTRACT

A method for forming a field effect transistor device includes patterning an arrangement of fin portions on a substrate, patterning a gate stack portion over portions of the fin portions and the substrate, growing an epitaxial material from the fin portions that electrically connects portions of adjacent fin structures, and removing a portion of the gate stack portion to expose a portion of the substrate.

6 Claims, 14 Drawing Sheets

US 9,059,021 B2

FINFET DEVICE

CROSS-REFERENCE TO RELATED APPLICATION

This application is a divisional of U.S. patent application Ser. No. 13/293,207 filed Nov. 10, 2011, now U.S. Pat. No. 8,697,514, the disclosure of which is incorporated by reference herein in its entirety.

BACKGROUND

The present invention relates to field effect transistor (FET) devices, and more specifically, to methods for fabrication and multi-gate FET devices.

Multi-gate FET devices include FinFET devices which are non-planar transistors disposed on a substrate. The FinFET device often includes active source and drain regions and a channel region that are formed from a silicon fin. The channel region is wrapped with gate materials such as polysilicon, metal materials, or high-k materials.

BRIEF SUMMARY

According to one embodiment of the present invention, a method for forming a field effect transistor device includes patterning an arrangement of fin portions on a substrate, patterning a gate stack portion over portions of the fin portions and the substrate, growing an epitaxial material from the fin portions that electrically connects portions of adjacent fin structures, and removing a portion of the gate stack portion to expose a portion of the substrate.

According to another embodiment of the present invention, a field effect transistor device includes an arrangement of fin portions disposed on a substrate, a first gate stack portion arranged over the arrangement of fin portions and portions of the substrate, a first epitaxial material connecting portions of the fin portions arranged in a first region defined by a first side of the first gate stack portion, a second epitaxial material connecting portions of the fin portions arranged in a second region defined by a second side of the first gate stack portion, and a second gate stack portion arranged substantially collinear to the first gate stack portion, the first gate stack portion and the second gate stack portion partially defined by a region of the substrate arranged between the first gate stack portion and the second gate stack portion.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2 illustrates a top view of fin portions arranged on a substrate.

FIG. 3 illustrates the resultant structure following the removal of a fin portion.

FIG. 4 illustrates the resultant structure following the formation of gate stack portions.

FIG. 5 illustrates the resultant structure following the formation of spacers over and adjacent to the gate stack portions.

FIG. 6 illustrates the resultant structure following the epitaxial growth of an epitaxial material.

FIG. 7 illustrates a side cut-away view along the line 7 of FIG. 6.

FIG. 8 illustrates an example of a photolithographic mask material.

FIG. 9 illustrates a side cut-away view along the line 9 of FIG. 8.

FIG. 10 illustrates the resultant structure following an etching process that removes the exposed portion of the oxide layer.

FIG. 11 illustrates the resultant structure following an etching process that removes exposed portions of the spacer.

FIG. 12 illustrates the resultant structure following an etching process that removes exposed portions of the gate stack.

FIG. 13 illustrates the resultant structure following the removal of the masking layer of FIG. 12.

FIG. 14 illustrates a top view of the resultant FinFET structure illustrated in FIG. 13.

DETAILED DESCRIPTION

Previous fabrication methods for FinFET devices included forming epitaxial regions that connect portions of adjacent fins of the FinFET devices following the patterning and fabrication of gate stacks. These methods may result in the formation of epitaxial regions that undesirably cause an electrical short between fins on opposing sides of the gate stack due to the geometry of the gate stack and the spacing of the adjacent fins.

Figure 1:
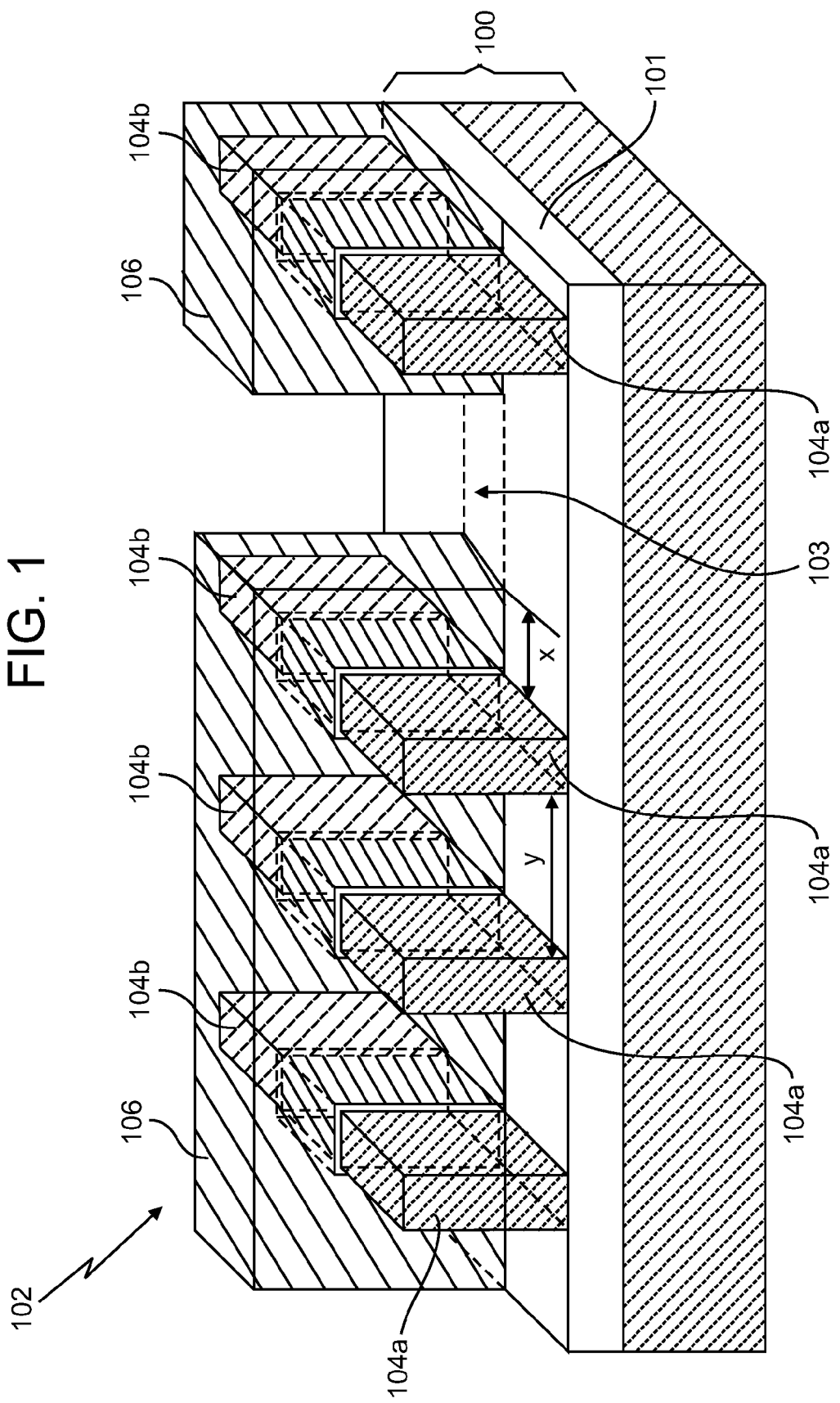
FIG. 1 illustrates a perspective view of an exemplary arrangement of FinFET devices.

FIG. 1 illustrates a perspective view of an exemplary arrangement of FinFET devices 102. The FinFET devices 102 include fin portions that are arranged in parallel on an insulator layer 101 of a substrate 100. A gate stack portion 106 is disposed over portions of the fin portions. A portion of the gate stack portion 106 has been removed such that a region 103 of the substrate 100 is exposed. In some embodiments, an epitaxial growth process may be performed to grow epitaxial material (not shown) from the exposed portions of the fin portions. It is desirable to grow the epitaxial material such that the exposed portions of the fin portions 104a are connected to each other on one side of the gate stack portion 106, while the exposed portions of the fin portions 104b are connected to each other on the opposing side of the gate stack portion 106. The fin portions 104 are arranged such that the spaces between the fin portions may be filled with the epitaxial material; however, it is undesirable to grow epitaxial material in the region 103 since the epitaxial material may form an electrical short between the fin portions 104a and 104b. The end of the gate stack portion 106 that defines a distance (x) from the end of the gate stack portion 106 to the adjacent fin portions 104a and 104b may sufficient to prevent undesired epitaxial growth in the 103 region, however if the distance x is less than the distance (y) defined by adjacent fin portions, the epitaxial growth in the region 103 may cause a short between the fin portions 104a and 104b. Thus, a method for fabricating a structure that allows epitaxial growth to connect adjacent fin portions without connecting opposing fin portions is described below.

Figure 2:
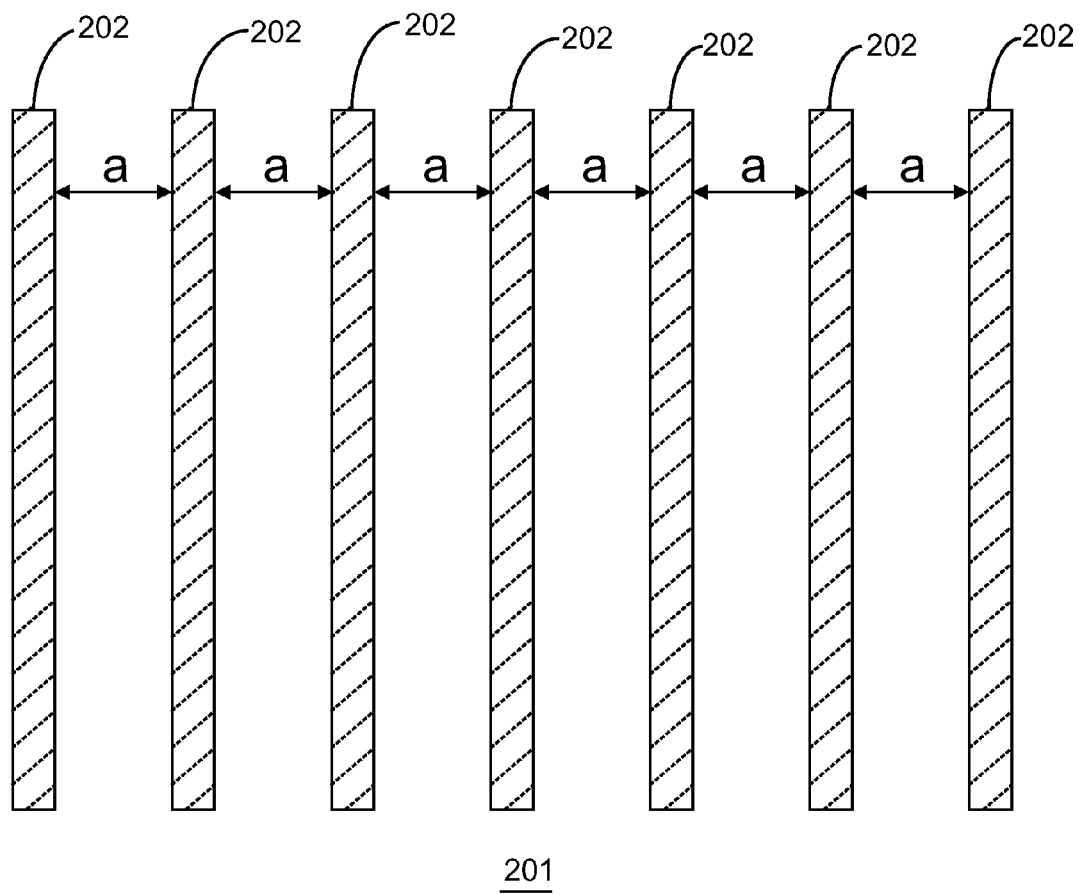
FIGS. 2-14 illustrate an exemplary method of fabrication and resultant embodiment of FinFET devices. In this regard.

FIG. 2 illustrates a top view of fin portions 202 arranged on a substrate 201. The substrate 201 may include, for example, an insulator layer. The fin portions 202 may be formed by any suitable process such as, for example, a lithographic patterning and etching process, and may include a silicon or germanium material. The fin portions 202 are arranged substantially parallel to each other, and define a distance (a) between each fin portion 202.

Figure 3:
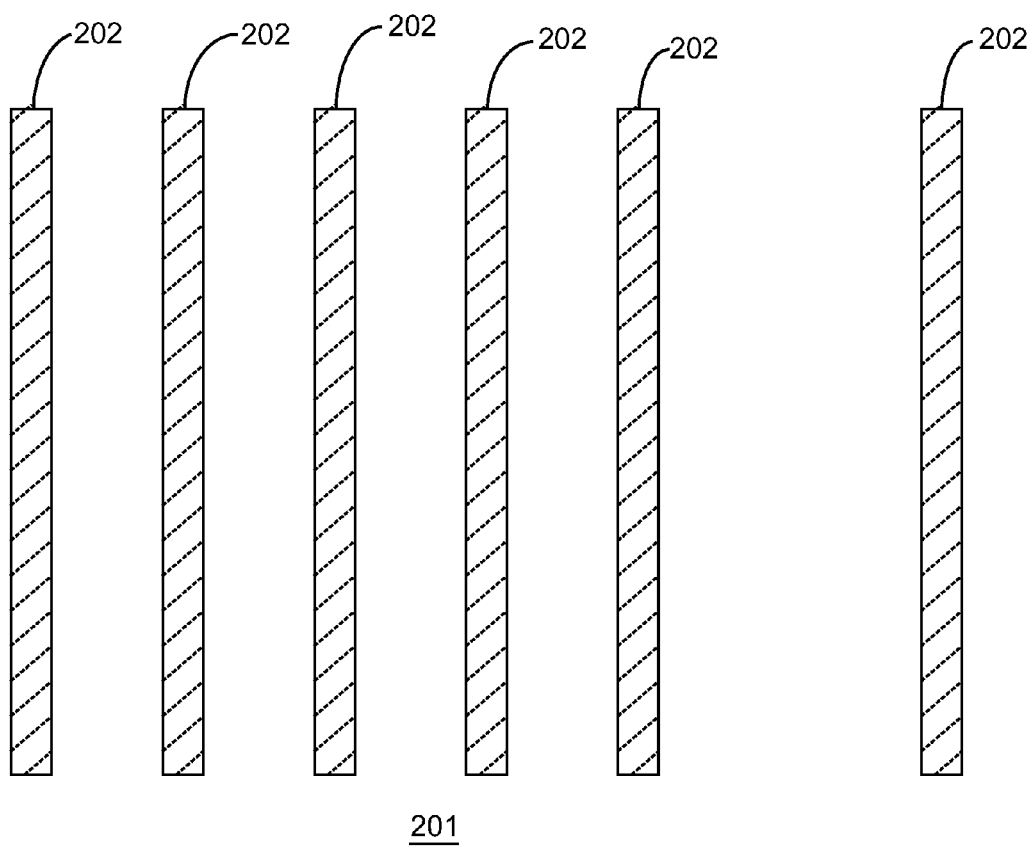

FIG. 3 illustrates the resultant structure following the removal of a fin portion 202 using, for example, a lithographic patterning and etching process. Though the illustrated embodiment shows the removal of one fin portion 202, any number of fin portions 202 may be removed according to design specifications.

Figure 4:
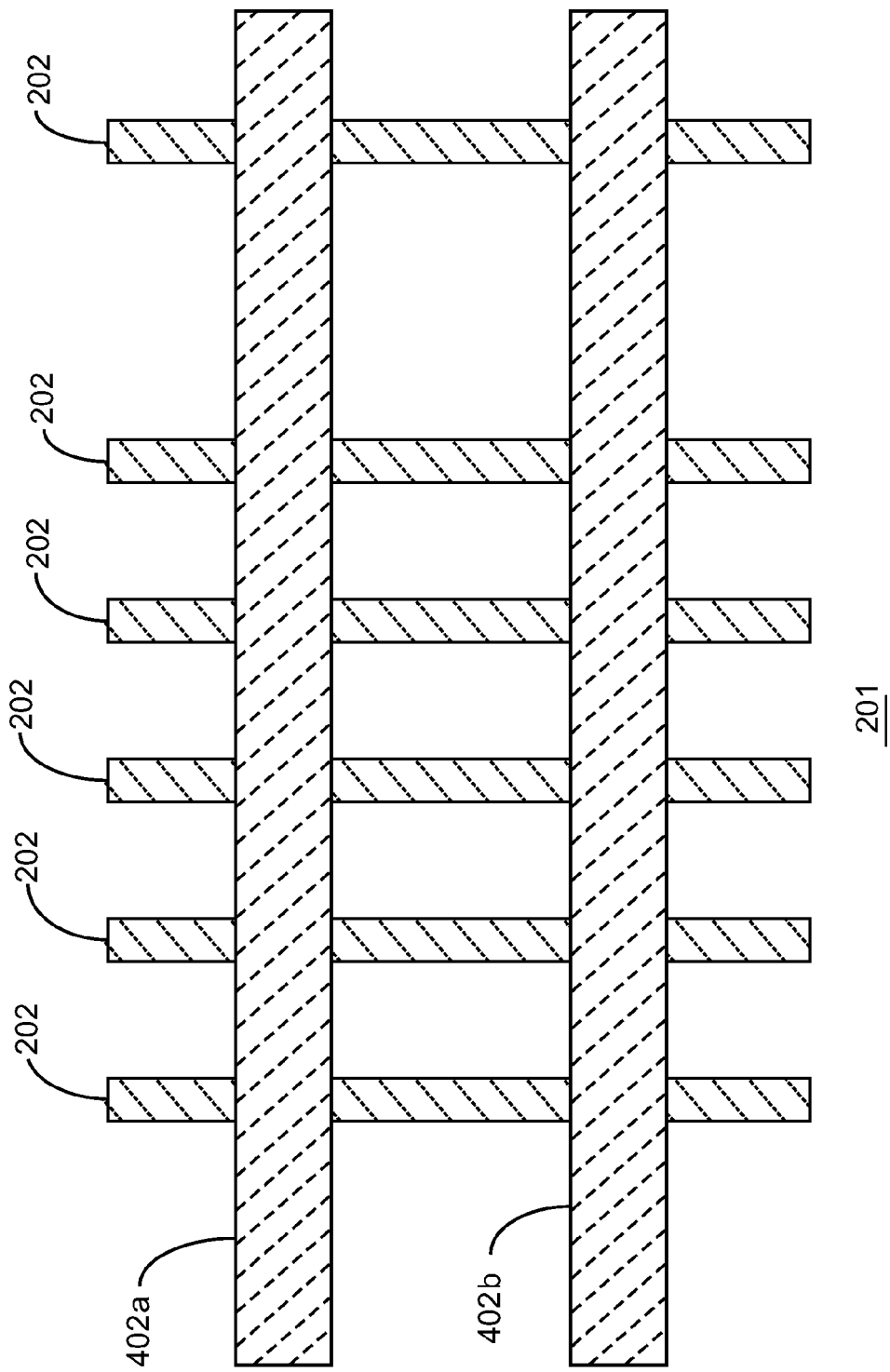

FIG. 4 illustrates the resultant structure following the formation of gate stack portions 402a, 402b. The gate stack portions 402a, 402b may be formed by any suitable deposition, patterning and etching process. For example, a gate dielectric material (not shown) such as an oxide or high-k material may be disposed over the substrate 201 and the fin portions 202, and a gate electrode material such as a polysilicon material may be formed over the gate dielectric material. A lithographic patterning and etching process may be used to form the gate stack portions 402a, 402b. The fin portions 202 are arranged substantially parallel to each other, and the gate stack portions 402a, 402b are arranged substantially perpendicular to the fin portions 202.

Figure 5:
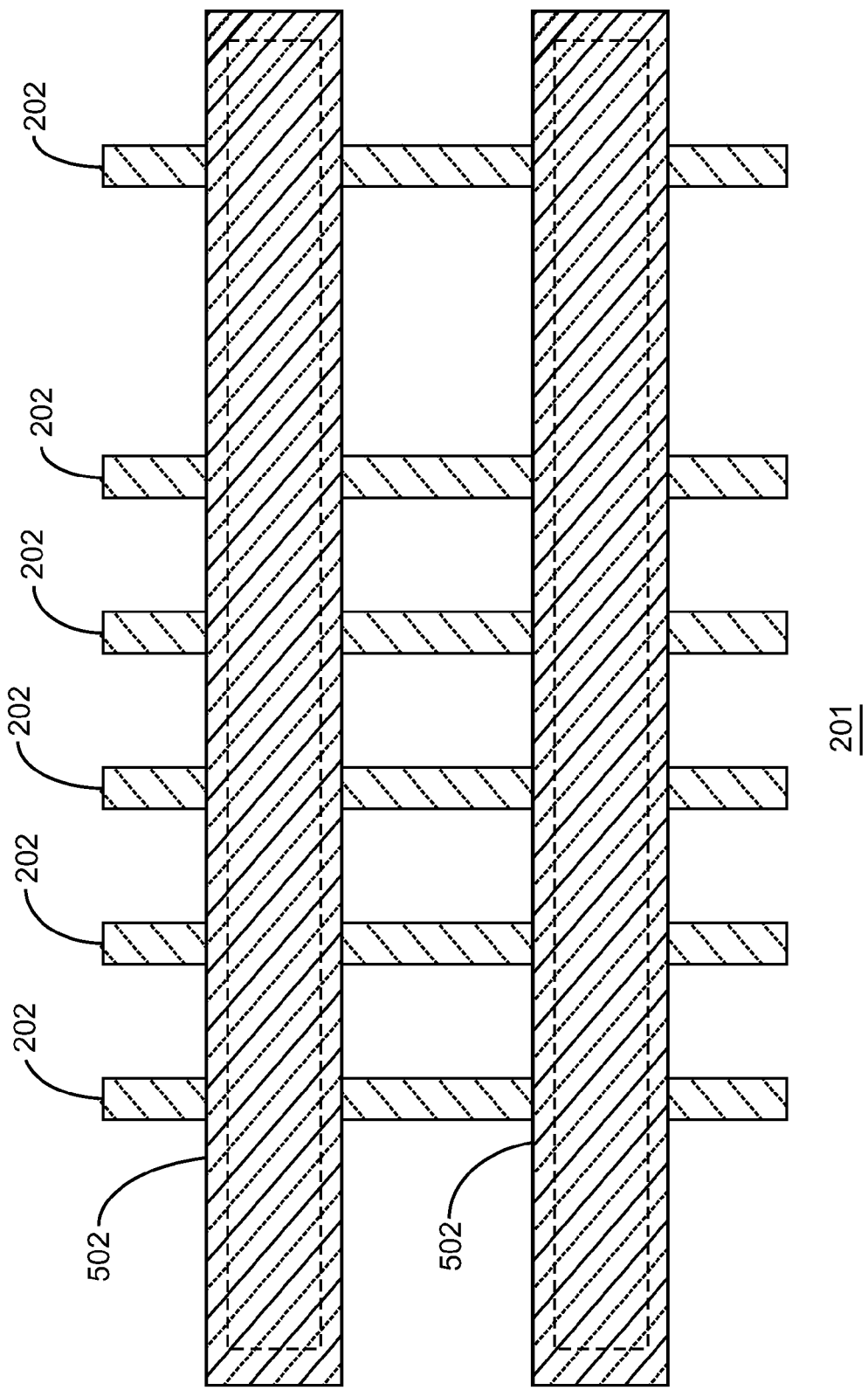

FIG. 5 illustrates the resultant structure following the formation of spacers 502 over and adjacent to the gate stack portions 402a, 402b (of FIG. 4). The spacers 502 may include, for example, an oxide or nitride material.

Figure 6:
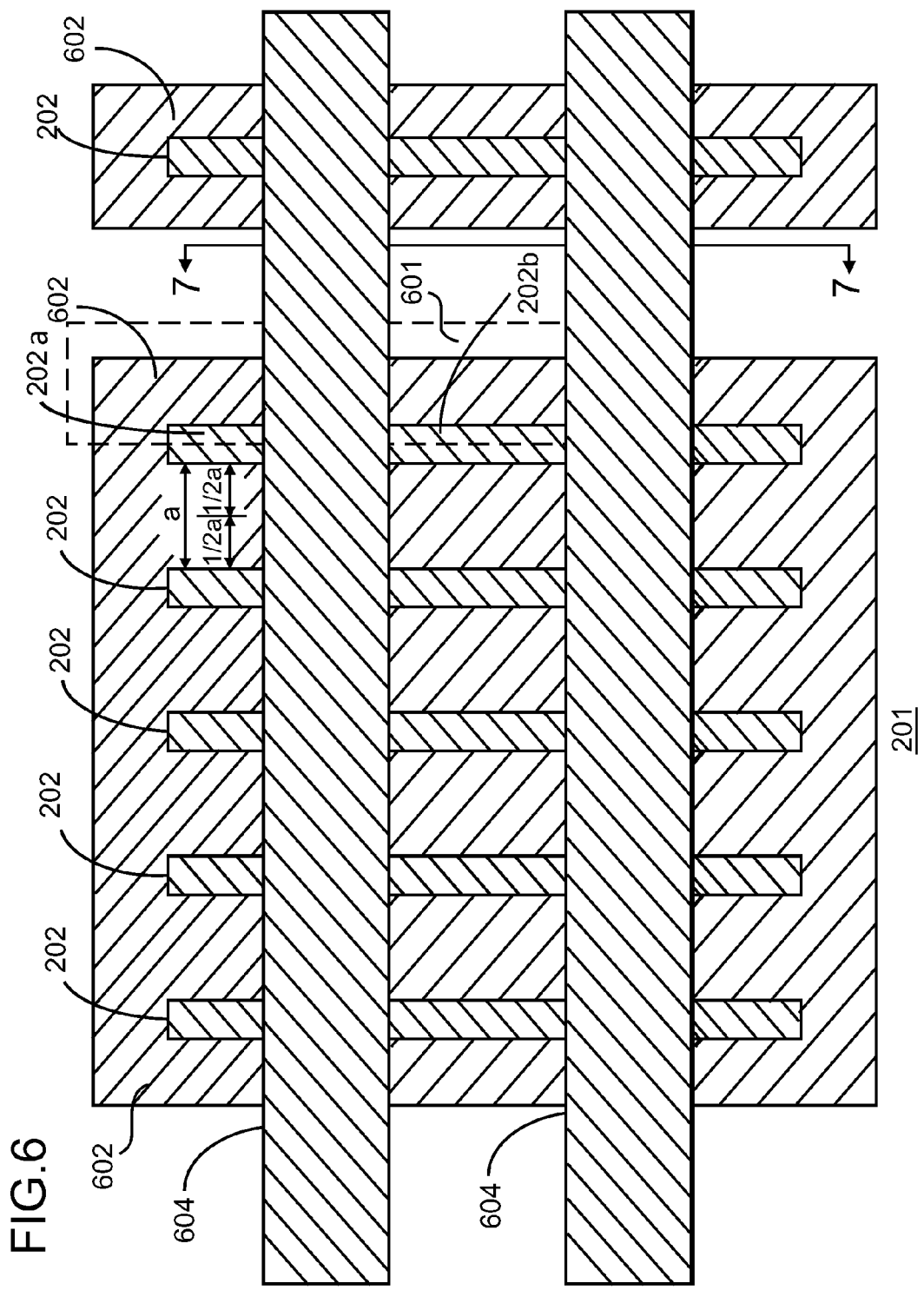

FIG. 6 illustrates the resultant structure following the epitaxial growth of an epitaxial material 602 that may include, for example, a silicon or germanium material. In this regard, the epitaxial material 602 is grown from exposed portions of the fin portions 202 such that some of the adjacent fin portions 202 are connected. An oxide material 604 may be formed on surfaces of the fin portions 202 and the spacers 502 (or in some embodiments the gate stack portions 402a, 402b) to prevent epitaxial growth from undesired portions of the devices. The epitaxial material 602 is grown from the sidewalls of the fin portions 202. The epitaxial growth process is timed or metered such that the epitaxial material 602 grown from adjacent fin portions 202 contact each other. In this regard, the epitaxial growth process is performed such that the epitaxial material 602 grows approximately ½ a from opposing sides of the fin portions 202. The epitaxial material 602 grown in the region 601 for example, extends from the fin portion 202a and 202b, however, the gate stack portion 402b inhibits epitaxial growth of the epitaxial material 602 that would result in an electrical short or connection between the fin portions 202a and 202b via epitaxial material 602.

Figure 7:
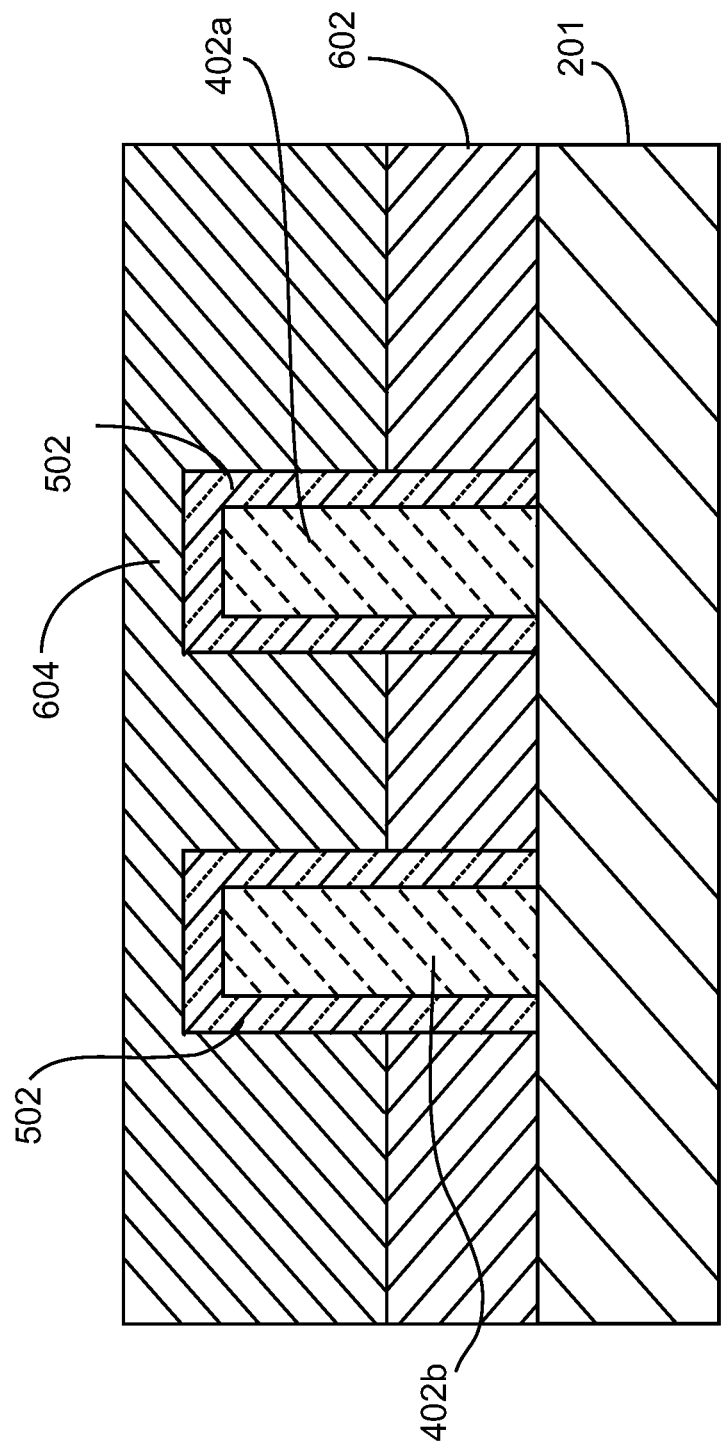

FIG. 7 illustrates a side cut-away view along the line 7 (of FIG. 6) and shows epitaxial material 602 arranged on the substrate 201.

Figure 8:
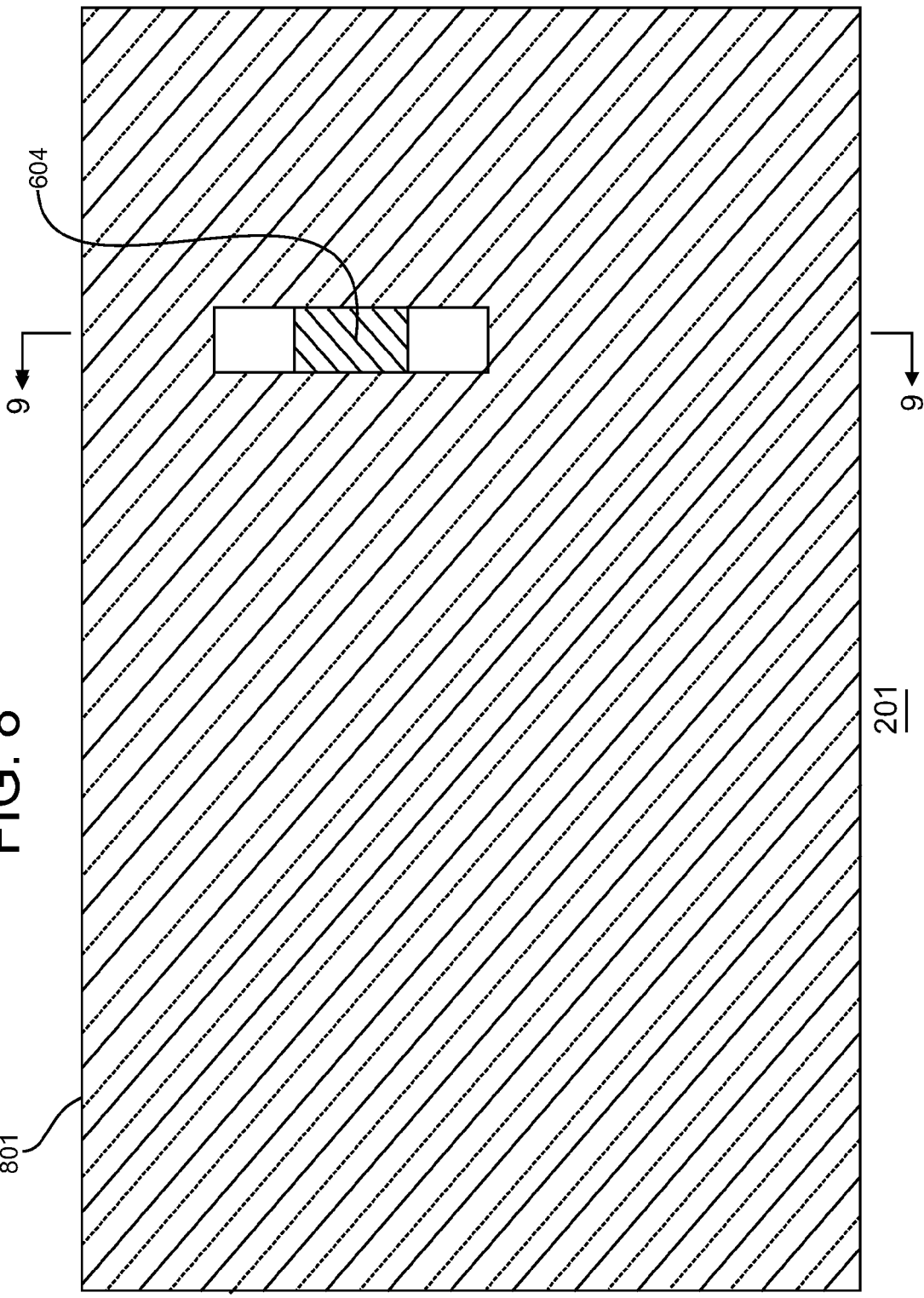

FIG. 8 illustrates an example of a photolithographic mask material 801 that has been patterned on exposed portions of the substrate 201, the fin portions 202, the epitaxial material 602, and portions of the gate stacks 402 (and/or portions of materials such as the spacers 502 and oxide layer 604 that may be formed over the gates stacks 402). A portion of the gate stack 402a remains exposed.

Figure 9:
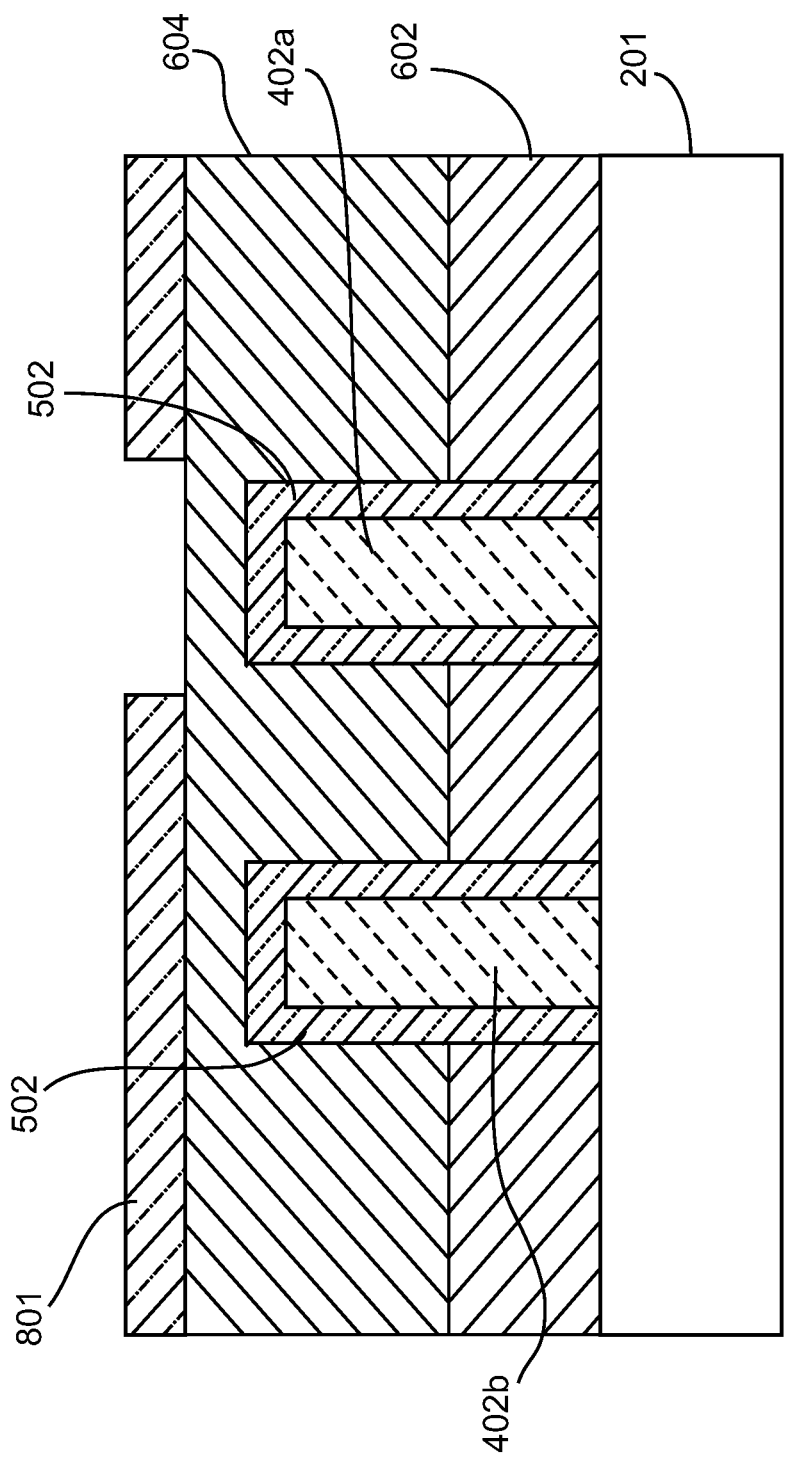

FIG. 9 illustrates a side cut-away view along the line 9 (of FIG. 8).

Figure 10:
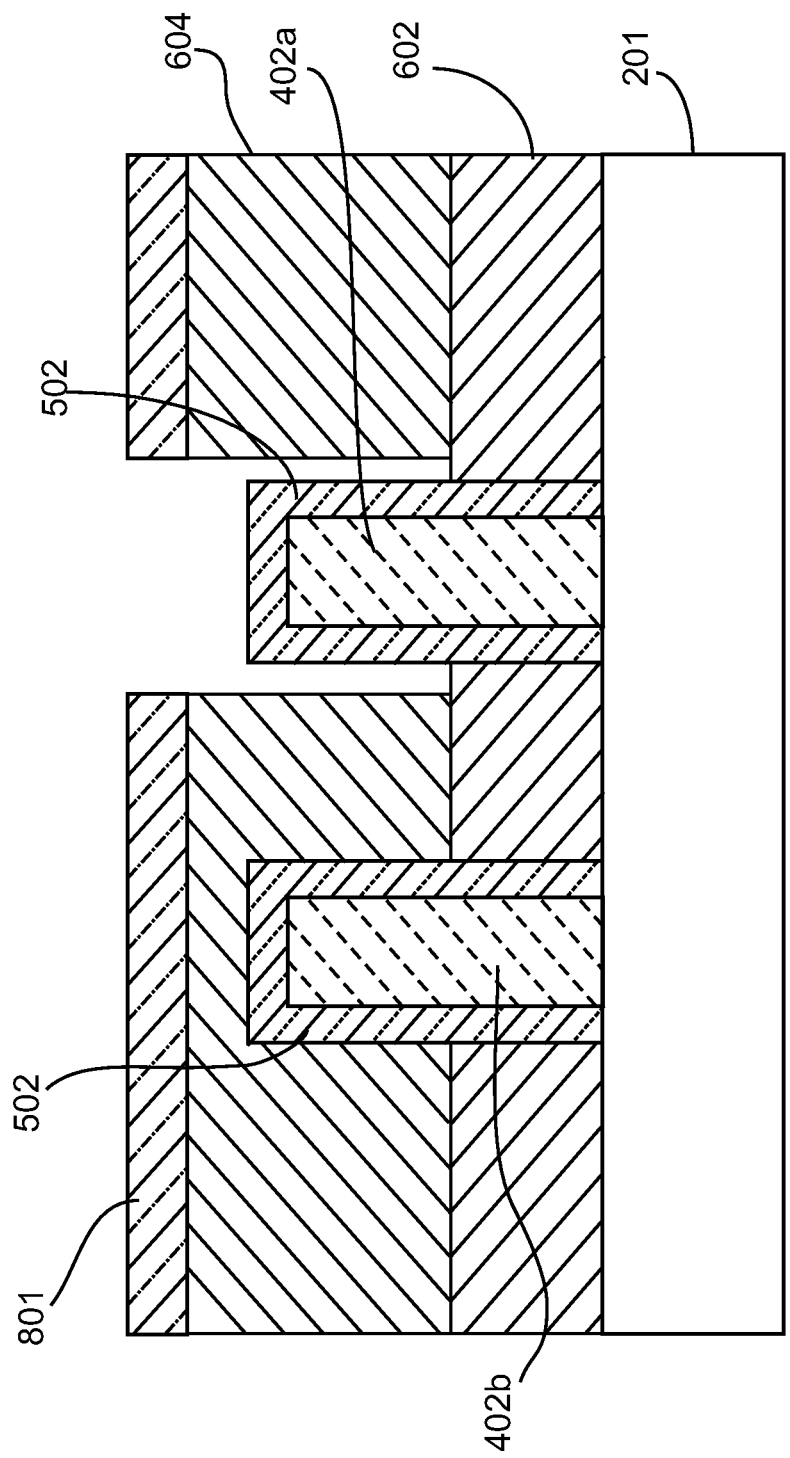

FIG. 10 illustrates the resultant structure following an etching process that removes the exposed portion of the oxide layer 604. The etching process may include any suitable etching process such as, for example, a dry etching process or reactive ion etching (RIE).

Figure 11:
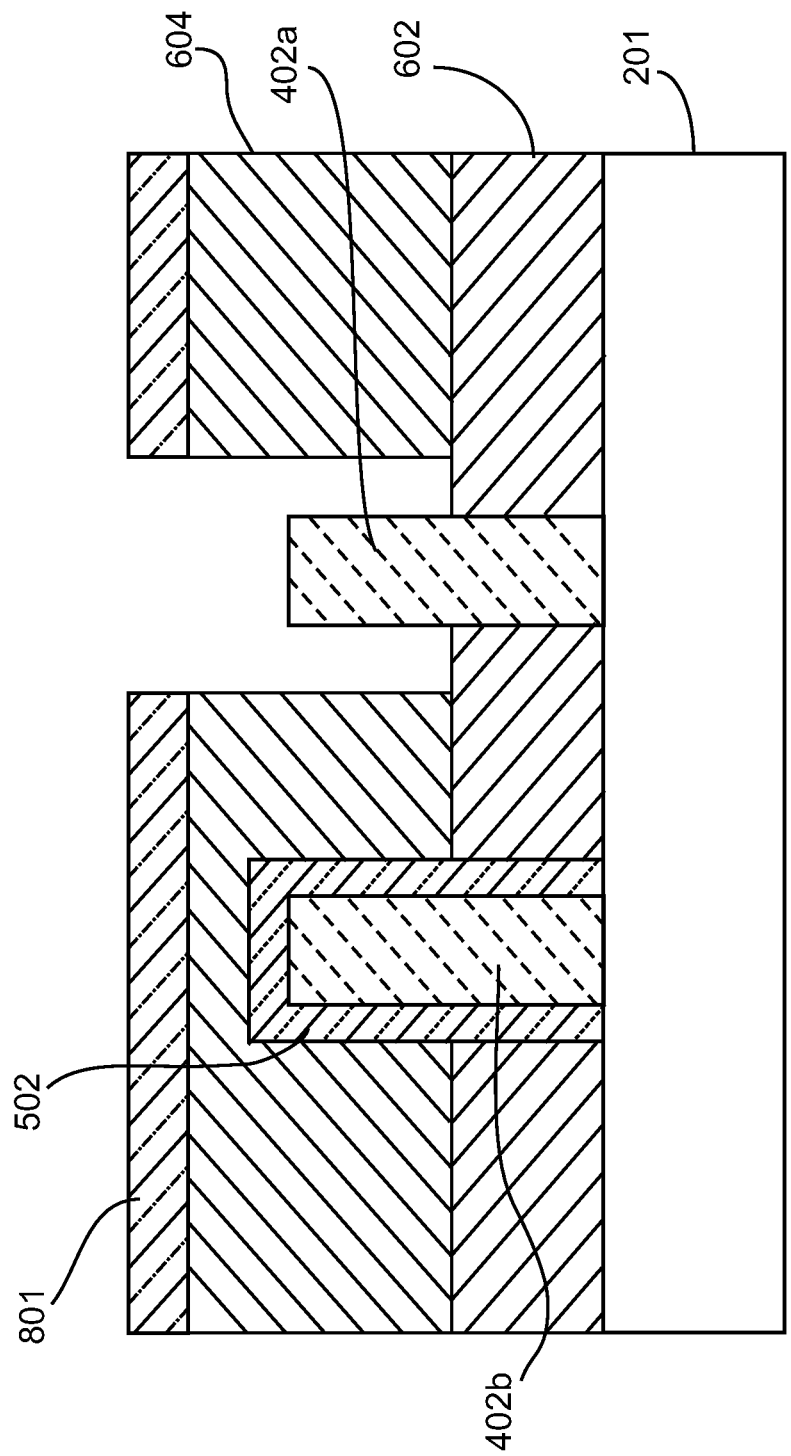

FIG. 11 illustrates the resultant structure following an etching process that removes exposed portions of the spacer 502 to expose a portion of the gate stack 402a, such as, for example a dry etching process.

Figure 12:
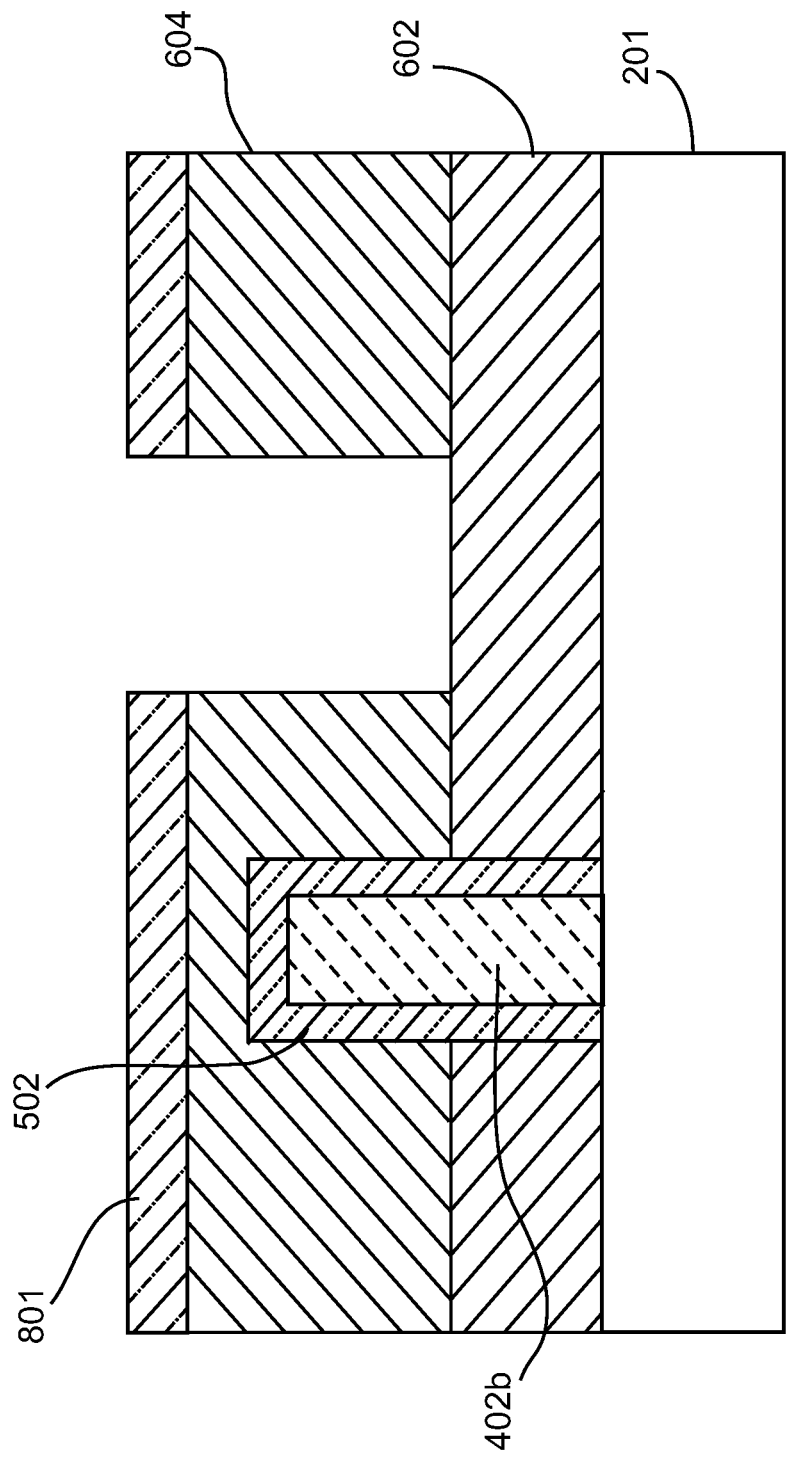

FIG. 12 illustrates the resultant structure following an etching process that removes exposed portions of the gate stack 402a. In this regard, the etching process may include a dry etch or RIE process that is selective to the spacer material (e.g., SiN) and oxide materials.

Figure 13:
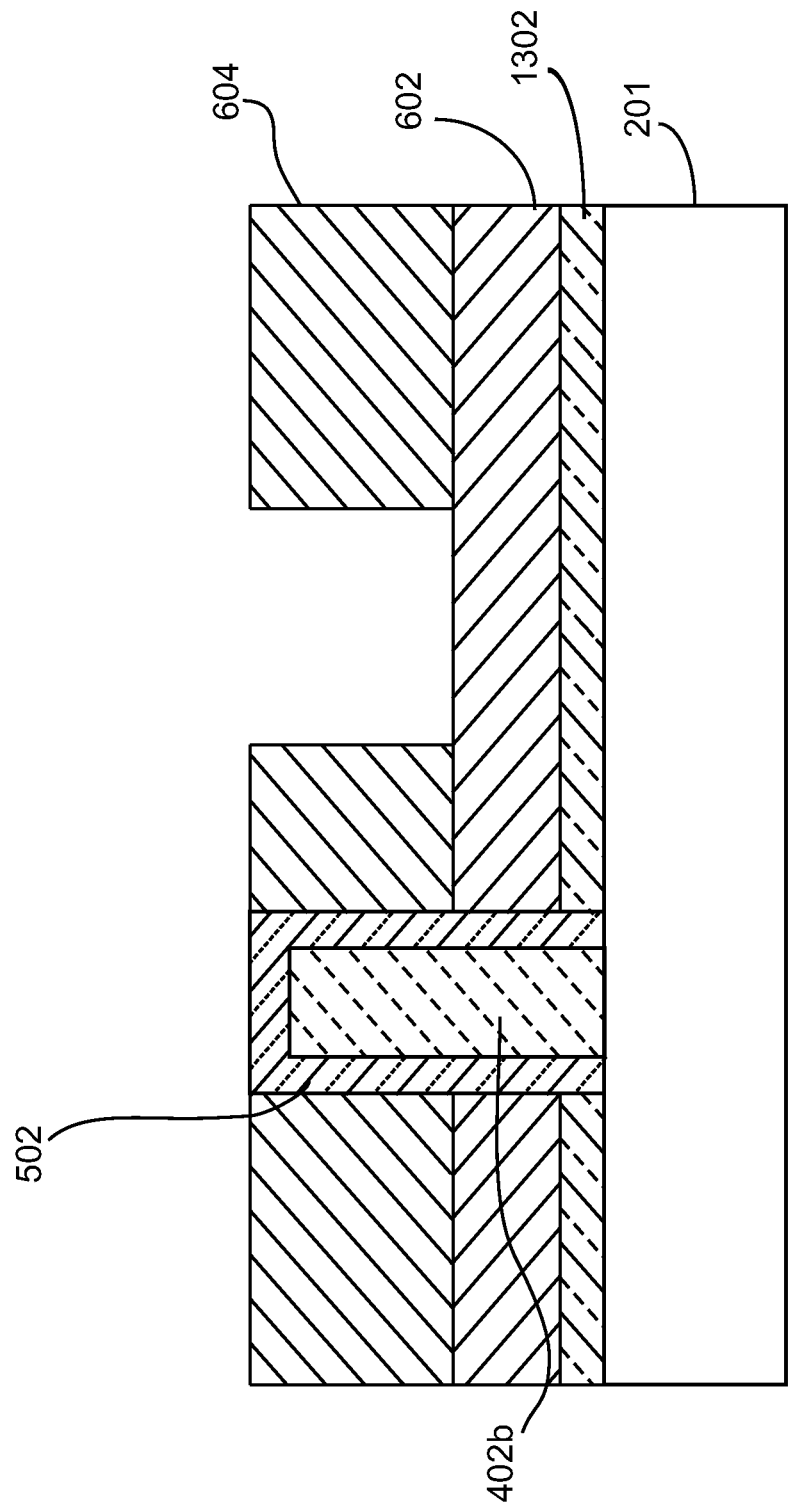

FIG. 13 illustrates the resultant structure following the removal of the masking layer 801 (of FIG. 12), the deposition of an oxide material 1302 over exposed portions of the substrate 201, and a chemical mechanical process (CMP) or other suitable planarizing process.

Figure 14:
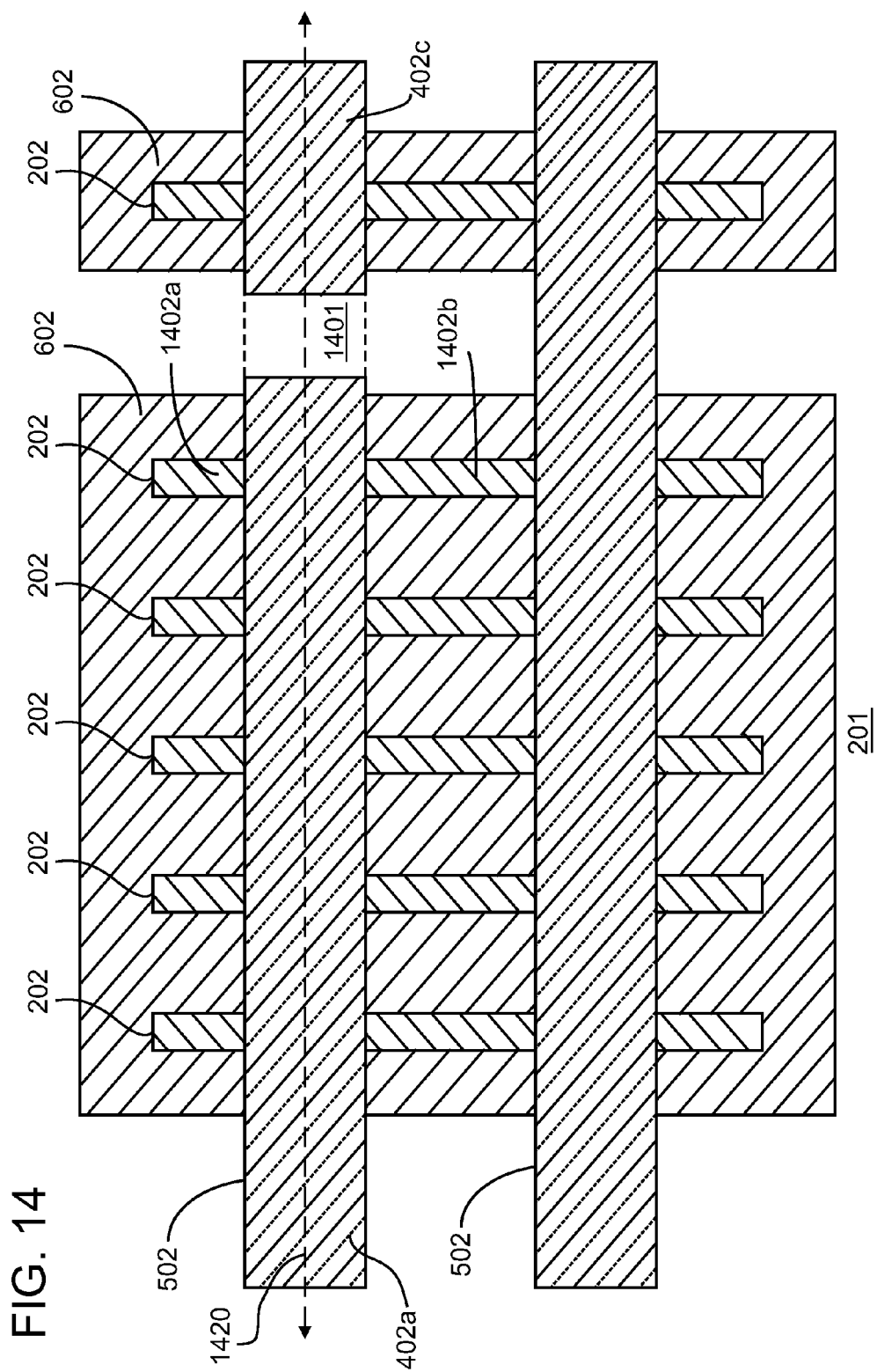

FIG. 14 illustrates a top view of the resultant FinFET structure illustrated in FIG. 13. The region 1401 illustrates the portion of the gate stack 402a (of FIG. 4) and the spacers 502 that were removed following the growth of the epitaxial material 602 as described above. The gate stack 402a and the spacers 502 inhibited the growth of epitaxial material 602 in the region 1401 thereby reducing the likelihood that the fin portions 1402a and 1402b could be electrically connected or shorted by the epitaxial material 602. The removal of the portion of the gate stack 402a in the region 1401 results in gate stack portions 402a and 402c arranged collinear along the line 1420 that illustrates longitudinal axis of the gate stack portions 402a and 402c, where the gate stack portions 402a and 402c are partially defined by the region 1401.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The invention claimed is:

1. A field effect transistor device comprising:
an arrangement of fin portions disposed on a substrate;
a first gate stack portion and a second gate stack portion arranged over the arrangement of fin portions and portions of the substrate;
a spacer, comprising a single material, formed over and adjacent to the first and second gate stack portions so as to completely cover top, side and edge surfaces of the first and second gate stack portions;
an oxide layer formed over the spacer and over exposed portions of the fin portions;
a first epitaxial material connecting portions of the fin portions arranged in a first region defined by a first side of the first gate stack portion;
a second epitaxial material connecting portions of the fin portions arranged in a second region defined by a second side of the first gate stack portion; and
the second gate stack portion arranged substantially collinear to the first gate stack portion, the first gate stack portion and the second gate stack portion partially defined by an exposed region of the substrate arranged between the first gate stack portion and the second gate stack portion.

2. The device of claim 1, wherein the device further comprises a third gate stack portion arranged substantially parallel to the first gate stack portion and the second gate stack portion.

3. The device of claim 2, wherein the region of the substrate arranged between the first gate stack portion and the second gate stack portion includes another oxide layer.

4. The device of claim 1, wherein the fin portions are arranged substantially in parallel to each other.

5. The device of claim 1, wherein the first gate stack portion is arranged substantially perpendicular to the fin portions.

6. The device of claim 1, wherein the second gate stack portion is arranged substantially perpendicular to the fin portions.

* * * * *